(12) United States Patent
Okunuki

(10) Patent No.: US 7,359,423 B2
(45) Date of Patent: Apr. 15, 2008

(54) DISTRIBUTED FEEDBACK LASER DIODE

(75) Inventor: Yuichiro Okunuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 233 days.

(21) Appl. No.: 11/041,721

(22) Filed: Jan. 25, 2005

(65) Prior Publication Data

US 2005/0276302 A1 Dec. 15, 2005

(30) Foreign Application Priority Data

Jun. 9, 2004 (JP) ............... 2004-171586

(51) Int. Cl.
*H01S 3/08* (2006.01)

(52) U.S. Cl. .................. 372/96; 372/92; 372/98; 372/102

(58) Field of Classification Search .......... 372/96
See application file for complete search history.

(56) References Cited

U.S. PATENT DOCUMENTS

| | | | | |
|---|---|---|---|---|
| 4,648,096 A | * | 3/1987 | Akiba et al. ............ | 372/96 |
| 4,701,930 A | * | 10/1987 | Akiba et al. ............ | 372/96 |
| 5,012,484 A | * | 4/1991 | Flynn et al. ............ | 372/96 |
| 5,111,475 A | * | 5/1992 | Ackerman et al. ...... | 372/96 |
| 5,208,822 A | * | 5/1993 | Haus et al. ............. | 372/50.1 |
| 5,345,460 A | * | 9/1994 | Takiguchi et al. ...... | 372/43.01 |
| 5,450,432 A | * | 9/1995 | Okuda .................... | 372/50.11 |
| 5,568,505 A | * | 10/1996 | Okuda et al. .......... | 372/96 |
| 6,175,581 B1 | * | 1/2001 | Sato ...................... | 372/50.11 |
| 6,526,087 B1 | * | 2/2003 | Okuda .................... | 372/96 |

FOREIGN PATENT DOCUMENTS

JP 03-248492 11/1991

OTHER PUBLICATIONS

Utaka et al., "Effect of Mirror Facets on Lasing Characteristics of Distributed Feedback InGaAsP/InP Laser Diodes at 1.5 µm Range", IEEE Journal of Quantum Electronics, vol. QE-20, No. 3, Mar. 1984, pp. 236-245.
T. Numai, "Fundamentals of Semiconductor Laser Engineering", Maruzen Co. Ltd., pp. 166-171.
K. Iga, "Semiconductor Laser", Ohmusha Ltd., pp. 278-279.

* cited by examiner

*Primary Examiner*—Minsun Oh Harvey
*Assistant Examiner*—Phillip Nguyen
(74) *Attorney, Agent, or Firm*—Leydig, Voit & Mayer, Ltd.

(57) ABSTRACT

A semiconductor laser includes an active layer on an n-type InP substrate. A diffraction grating and a p-type InP cladding layer are above the active layer. The diffraction grating has at least one phase shift portion. Facets of the distributed feedback laser each have thereon an antireflective film having a reflectance of 3% or less. The diffraction grating does not extend into end regions of the distributed feedback laser, each end region extending 1 µm-20 µm from a respective one of the facets toward an opposite end in a waveguide direction.

6 Claims, 7 Drawing Sheets

DISTRIBUTED FEEDBACK LASER DIODE

BACKGROUND OF THE INVENTION

1. Field of the Invention

The present invention relates to a distributed feedback laser diode, and more particularly to a distributed feedback semiconductor laser diode primarily used for optical fiber communications.

2. Background Art

Distributed feedback laser diodes have a structure (or a diffraction grating) in which the refractive index or the gain varies periodically along the traveling direction of the light within the laser. As is known, a distributed feedback laser diode with a uniform diffraction grating having a simple periodic structure oscillates in two longitudinal modes (or at two wavelengths) if both facets of the laser are nonreflective (see, for example, a book entitled "Fundamentals of Semiconductor Laser Engineering", by Takahiro Numai, Maruzen Co., Ltd., p. 166-171). Therefore, practically, the distributed feedback laser diode is configured such that one facet is nonreflective or low-reflective and the other facet is highly reflective in order to produce a single longitudinal mode oscillation.

Even such a configuration, however, cannot allow every (laser) element to oscillate in a single longitudinal mode. Specifically, whether a laser element can oscillate in a single longitudinal mode depends on the phase of the diffraction grating at each facet of the laser (hereinafter referred to as an "facet phase"). That is, it is theoretically possible to control each facet phase so as to ensure that the laser can oscillate in a single longitudinal mode. However, the period of the diffraction grating is as short as approximately 200 nm and furthermore each facet of the resonator is formed through crystal cleavage in a semiconductor laser manufacturing process, which makes it practically impossible to control each facet phase. Therefore, it happens that even though some lasers can oscillate in a single longitudinal mode, others cannot. This has led to a reduction in the yield of conventional distributed feedback laser diodes.

A diffraction grating structure called the "$\lambda/4$ phase shift diffraction grating" has been used to overcome such a problem (see, for example, the above book "Fundamentals of Semiconductor Laser Engineering"). In this structure, both facets of the laser are made nonreflective, allowing the laser to stably oscillate in a single longitudinal mode regardless of the phase of each facet. In this case, the position of the phase shift portion primarily determines the ratio of the optical output from the front facet of the laser to that from the rear facet (hereinafter referred to as "front-to-back ratio"). For example, when the phase shift portion is located at the center portion of the resonator, the front-to-back ratio is 1:1.

It should be noted, however, that though, ideally, both facets of the above laser must be nonreflective, their reflectance may not be able to be set to zero if the laser production accuracy is not sufficiently high. An increase in the reflectance of the facets leads to a reduction in the yield of lasers meeting the requirement of single longitudinal mode oscillation even if they employ a $\lambda/4$ phase shift diffraction grating. Therefore, to prevent this from happening, it is necessary to reduce the effective reflectance of each facet. On the other hand, as is known in the art, forming a window structure near an facet can reduce its effective reflectance (see, for example, Katsuyuki Utaka et al., IEEE Journal of Quantum Electronics, vol. QE-20, No. 3, 1984, p. 236-245). Accordingly, this technique may be applied to a $\lambda/4$ phase shift diffraction grating to reduce the effective reflectance of the facets.

As described above, each facet of a semiconductor laser resonator is typically formed through crystal cleavage. That is, each semiconductor laser element is cut from a semiconductor substrate by way of crystal cleavage. At that time, the position at which cleavage occurs is not precisely controlled; the variation in the position is approximately ±5 μm to ±20 μm. Such a variation in the cleavage position may cause the phase shift portion to be displaced from its target position (for example, from the center portion of the resonator), which leads to a variation in the front-to-back ratio of the optical output. Since lasers usually utilize only the optical output from the front facet, a variation in the front-to-back ratio implies a variation in the laser efficiency. That is, conventional $\lambda/4$ phase shift type semiconductor lasers have a problem in that their laser efficiencies vary due to variations in the cleavage positions. Such variations in the efficiencies reduce the uniformity among the characteristics of the distributed feedback laser diodes, resulting in a reduction in the yield.

In the case of distributed feedback laser diodes having a window structure, on the other hand, the window portion(s) has no diffraction grating formed therein. Therefore, even if a cleavage position is displaced from the desired position, the laser efficiency does not change since the position of the phase shift portion within the resonator (exclusive of the window portion) remains unchanged. However, as described later, lasers having a window structure have a problem in that the light emission direction tends to shift vertically, resulting in a reduction in the coupling efficiency with the optical fiber.

The n-type InP substrate typically has a carrier concentration of $1 \times 10^{19}$ cm$^{-3}$ (or more), which is approximately 10 times higher than the carrier concentrations of the other components of the semiconductor laser. Therefore, due to the plasma effect, the n-type InP substrate has a lower refractive index than the other components. As a result, the laser light is emitted upward since it is affected by the lower refractive index of the n-type InP substrate at the window portion. Furthermore, the n-type InP blocking layer is often set to a high carrier concentration, as compared to the p-type InP cladding layer and the p-type InP blocking layer, which produces a refractive index distribution affecting the light emission direction.

Thus, even though distributed feedback lasers having a window structure do not have the problem of the variations in the laser efficiencies due to variations in the cleavage positions, their emission direction tends to be shifted vertically, resulting in a reduction in the coupling efficiency with the optical fiber.

SUMMARY OF THE INVENTION

The present invention has been devised in view of the above problems. It is, therefore, an object of the present invention to provide a phase shift type distributed feedback laser diode capable of reducing the variations in the laser efficiencies due to variations in the cleavage positions, as well as preventing the light emission direction from being shifted vertically.

According to one aspect of the present invention, a distributed feedback laser diode comprises a semiconductor substrate, an active layer provided above the semiconductor substrate, a cladding layer provided above the active layer, and a diffraction grating formed near the active layer such that it extends along a waveguide direction, the diffraction grating having at least one phase shift portion. Both facets of the distributed feedback laser diode have thereon an antireflective film having a reflectance of 3% or less. The diffraction grating does not extend into end regions of the distributed feedback laser diode, each end region extending 1 μm-20 μm from a respective one of the facets toward the opposite end in the waveguide direction.

According to another aspect of the present invention, a distributed feedback laser diode comprises a semiconductor substrate, an active layer provided above the semiconductor substrate, a cladding layer provided above the active layer, and a diffraction grating formed near the active layer such that it extends along a waveguide direction, the diffraction grating having at least one phase shift portion. A front facet and a rear facet of the distributed feedback laser diode each have formed thereon an antireflective film having a reflectance of 3% or less. The distributed feedback laser diode has a window structure adjacent the rear facet. The diffraction grating does not extend into a front end region of the distributed feedback laser diode, the front end region extending 1 μm-20 μm from the front facet toward the opposite end in the waveguide direction.

Other objects and advantages of the present invention will become apparent from the following description.

DETAILED DESCRIPTION OF THE PREFERRED EMBODIMENTS

First Embodiment

Figure 1:
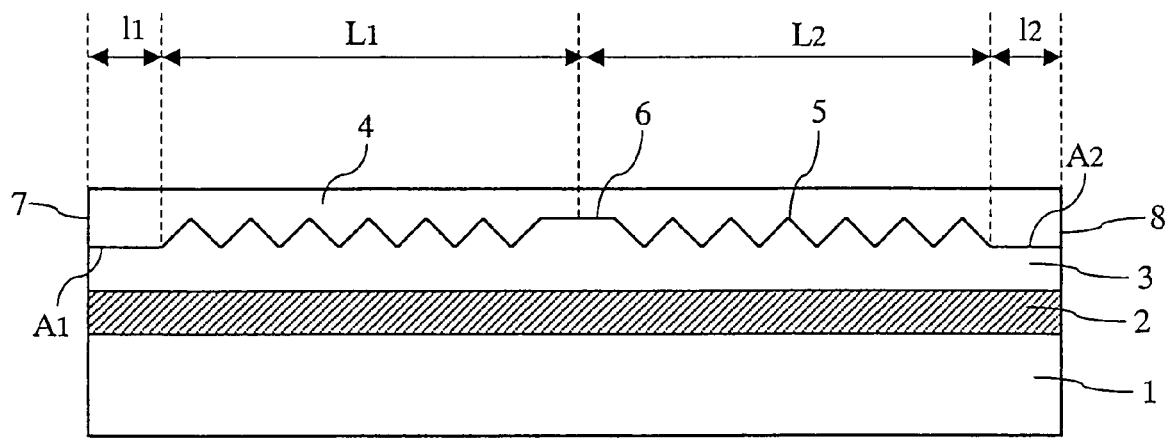
FIG. 1 is a schematic cross-sectional view of a distributed feedback laser diode according to a first embodiment.

FIG. 1 is a schematic cross-sectional view of the resonator portion of a distributed feedback laser diode according to a first embodiment of the present invention.

Referring to FIG. 1, an active layer 2 of InGaAsP, an InGaAsP light guiding layer 3, and a p-type InP cladding layer 4 are laminated onto one another over an n-type InP substrate 1 (a semiconductor substrate) in that order. It should be noted that these layers may be formed of a material such as AlGaInAs or GaInNAs, instead of InP or InGaAsP above. Further, the n-type substrate may be replaced by a p-type substrate. In such a case, the polarity of the laser diode is opposite to that of the laser diode using the n-type substrate.

Further, the interface between the InGaAsP light guiding layer 3 and the p-type InP cladding layer 4 is formed to have a cross-sectional saw tooth shape, constituting a diffraction grating 5. It should be noted that even though the example shown in FIG. 1 is configured such that the InGaAsP light guiding layer 3 and the diffraction grating 5 are provided on the p-type InP cladding layer 4 side, the present invention is not limited to this particular arrangement. It may be possible to employ any arrangement in which the diffraction grating 5 is formed near the active layer 2 along the waveguide direction (in FIG. 1, the direction parallel to the paper). For example, the InGaAsP light guiding layer 3 and the diffraction grating 5 may be provided on the n-type InP substrate 1 side. Further, the diffraction grating 5 may have a shape other than a saw tooth.

At the center portion of the resonator is provided a phase shift portion 6, at which the phase of the diffraction grating 5 is shifted. It should be noted that the phase shift portion 6 may not necessarily be disposed at the center portion of the resonator. For example, the phase shift portion 6 may be moved toward the front facet side to increase the optical output from the front facet and thereby enhance the laser efficiency. Further, even though the resonator shown in FIG. 1 has only one phase shift portion 6, the present invention is not limited to this particular arrangement. The diffraction grating may include (one or) a plurality of phase shift portions. Providing a plurality of phase shift portions reduces the spatial hole burning in the axial direction within the resonator, which leads to stable single longitudinal mode oscillation even at high optical output.

On the other hand, the facets 7 and 8 of the resonator each have an antireflective film (not shown) thereon. If the reflectance of the facets is too high, there will be a reduction in the yield of laser elements capable of oscillating in a single longitudinal mode. Therefore, the lower the reflectance of the facets 7 and 8, the better. Specifically, the reflectance should be 3% or less, preferably 0.5% or less.

The present embodiment is characterized in that the diffraction grating 5 does not extend into regions $A_1$ and $A_2$ adjacent to the respective facets of the semiconductor laser (that is, these regions are not grated), as shown in FIG. 1. The "ungrated" regions $A_1$ and $A_2$ do not contribute to laser oscillation. Therefore, (according to the present embodiment) the shorter these regions, the better. Specifically, the lengths $l_1$ and $l_2$ of the regions $A_1$ and $A_2$, respectively, are preferably approximately 20 μm at longest. If the manufacturing process is capable of controlling the cleavage positions with high precision, the lengths may be further reduced. For example, when the positional accuracy of the cleavage is ±2 μm, the lengths $l_1$ and $l_2$ of the regions $A_1$ and $A_2$ are preferably approximately 1 μm. In other words, according to the present embodiment, the diffraction grating 5 preferably does not extend into each end region of the resonator which extends 1 μm-20 μm from a respective one of the facets 7 and 8 toward the opposite end in the waveguide direction (that is, these end regions are preferably not grated).

Such an arrangement makes it possible to maintain a constant length of the portion of the diffraction grating 5 on each side of the phase shift portion 6 regardless of the amount of displacement of the cleavage position, as will be described below with reference to FIGS. 1 and 2.

Figure 2:
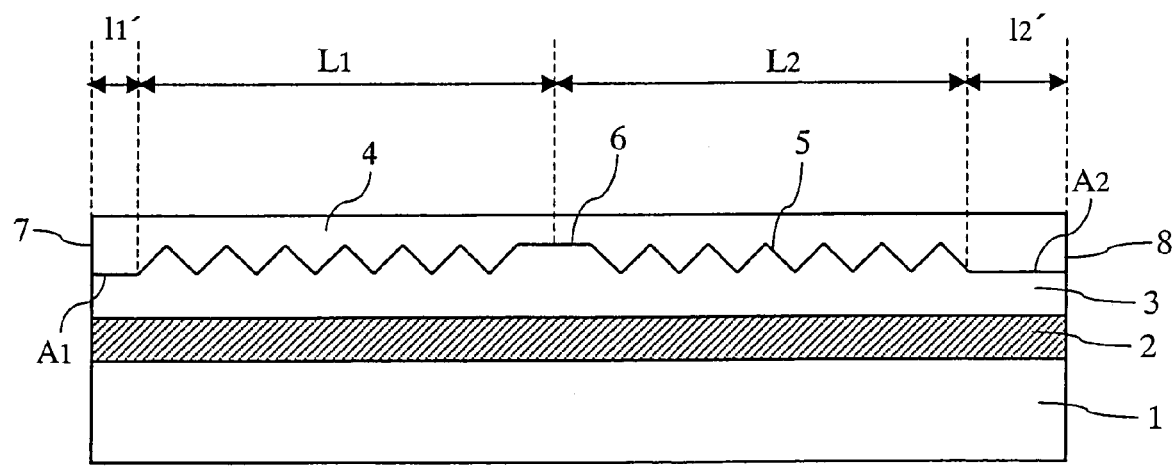
FIG. 2 is a schematic cross-sectional view of a distributed feedback laser diode according to a first embodiment.

FIG. 2 is a schematic cross-sectional view of the resonator portion of another distributed feedback laser diode according to the present embodiment. The resonator shown in FIG. 2 has the same configuration as the resonator shown in FIG. 1 except that their cleavage positions are different. Specifically, in FIG. 2 the phase shift portion 6 is provided at a distance from the center portion of the resonator, whereas in FIG. 1 the phase shift portion 6 is formed at the center portion of the resonator. Consequently, the lengths $l_1'$ and $l_2'$ of the "ungrated" regions $A_1$ and $A_2$ shown in FIG. 2 are different from the lengths $l_1$ and $l_2$ of those shown in FIG. 1. However, the length ($L_1$, $L_2$) from the phase shift portion 6 to each edge of the diffraction grating 5 is the same in both figures. Therefore, the present embodiment can maintain a constant front-to-back ratio of the optical output and hence a constant laser efficiency regardless of the amount of displacement of the cleavage positions, resulting in a high yield of lasers exhibiting high uniformity among their characteristics.

Further, since the distributed feedback laser diode of the present embodiment has no window structure, its light emission direction is not shifted vertically, providing a high coupling efficiency with the optical fiber.

Second Embodiment

Figure 3:
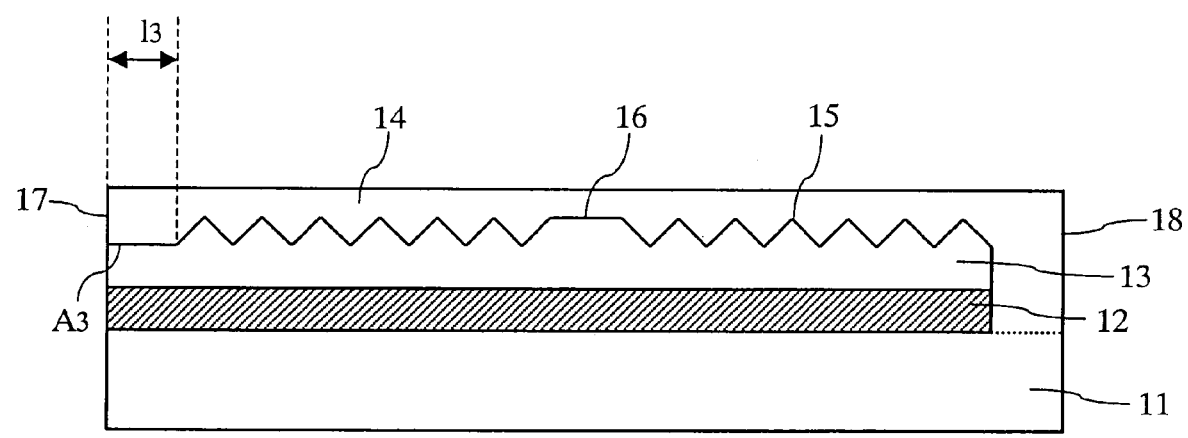
FIG. 3 is a schematic cross-sectional view of a distributed feedback laser diode according to a second embodiment.

FIG. 3 is a schematic cross-sectional view of the resonator portion of a distributed feedback laser diode according to a second embodiment of the present invention.

The distributed feedback laser diode of the present embodiment is characterized in that the rear end region has a window structure while the front end region has the same structure as in the first embodiment.

Referring to FIG. 3, an active layer 12 of InGaAsP, an InGaAsP light guiding layer 13, and a p-type InP cladding layer 14 are laminated onto one another over an n-type InP substrate 11 (a semiconductor substrate) in that order. It should be noted that in the figure, the border between the n-type InP substrate 11 and the p-type InP cladding layer 14 is indicated by a dotted line. The reason for this is that it is not possible to pinpoint the position of the actual border since the substrate 11 and the cladding layer 14 are made of the same material InP.

It should be further noted that the above layers may be formed of a material such as AlGaInAs or GaInNAs, instead of InP or InGaAsP above. Further, the n-type substrate may be replaced by a p-type substrate. In such a case, the polarity of the laser diode is opposite to that of the laser diode using the n-type substrate.

Further, the interface between the InGaAsP light guiding layer 13 and the p-type InP cladding layer 14 is formed to have a cross-sectional saw tooth shape, constituting diffraction grating 15. However, according to the present embodiment, the rear end region has a window structure and therefore is not grated (that is, the diffraction grating 15 does not extend into this region), as shown in FIG. 3.

It should be noted that even though the example shown in FIG. 3 is configured such that the InGaAsP light guiding layer 13 and the diffraction grating 15 are provided on the p-type InP cladding layer 14 side, the present invention is not limited to this particular arrangement. It may be possible to employ any arrangement in which the diffraction grating 15 is formed near the active layer 12 along the waveguide direction (in FIG. 3, the direction parallel to the paper). For example, the InGaAsP light guiding layer 13 and the diffraction grating 15 may be provided on the n-type InP substrate 11 side. Further, the diffraction grating 15 may have a shape other than a saw tooth.

At the center portion of the resonator is provided a phase shift portion 16, at which the phase of the diffraction grating 15 is shifted. It should be noted that the phase shift portion 16 may not necessarily be disposed at the center portion of the resonator. For example, the phase shift portion 16 may be moved toward the front facet side to increase the optical output from the front facet and thereby enhance the laser efficiency. Further, even though the resonator shown in FIG. 3 has only one phase shift portion 16, the present invention is not limited to this particular arrangement. The diffraction grating may include (one or) a plurality of phase shift portions.

According to the present embodiment, the front facet 17 and the rear facet 18 of the laser each have an antireflective film (not shown) formed thereon. If the reflectance of the facets is too high, there will be a reduction in the yield of laser elements capable of oscillating in a single longitudinal mode. Therefore, the lower the reflectance of the facets 17 and 18, the better. Specifically, the reflectance should be 3% or less, preferably 0.5% or less.

The diffraction grating 15 does not extend into a region $A_3$ adjacent to the front facet 17 (that is, this region is not grated), as in the first embodiment. The shorter the region $A_3$, the better, since the region $A_3$ does not contribute to laser oscillation. Specifically, the region $A_3$ is preferably 20 μm or less in length. For example, when the positional accuracy of the cleavage is ±2 μm, the length $l_3$ of the region $A_3$ is preferably approximately 1 μm. In other words, according to the present embodiment, the diffraction grating 15 preferably does not extend into the front end region of the resonator which extends 1 μm-20 μm from the front facet 17 toward the opposite end in the waveguide direction (that is, this region is preferably not grated).

Thus, according to the present embodiment, the end region of the resonator of the laser on the front facet 17 side is not grated, and the end region of the resonator on the rear facet 18 side has a window structure. Such an arrangement makes it possible to maintain a constant length of the portion of the diffraction grating 15 on each side of the phase shift portion 16 regardless of the amount of displacement of the cleavage position, as in the first embodiment. Further, since the end region on the rear facet 18 side has a window structure, the effective reflectance of the rear facet 18 can be reduced, resulting in a high yield of lasers capable of oscillating in a single longitudinal mode even when the reflectance of the facets cannot be set sufficiently low.

Third Embodiment

Figure 4:
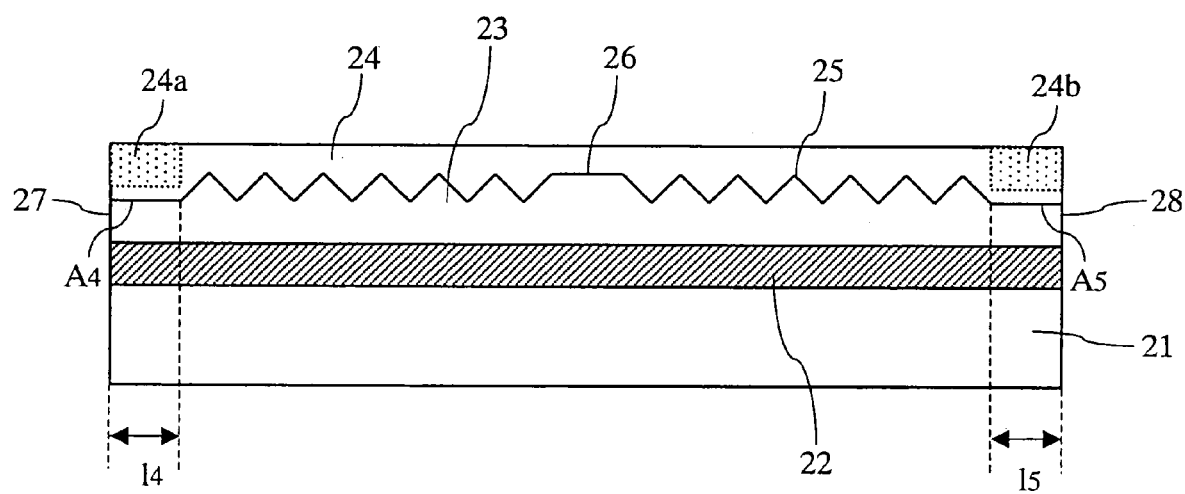
FIG. 4 is a schematic cross-sectional view of a distributed feedback laser diode according to a third embodiment.

FIG. 4 is a schematic cross-sectional view of the resonator portion of a distributed feedback laser diode according to a third embodiment of the present invention.

Referring to FIG. 4, an active layer 22 of InGaAsP, an InGaAsP light guiding layer 23, and a p-type InP cladding layer 24 are laminated onto one another over an n-type InP substrate 21 (a semiconductor substrate) in that order. It should be noted that these layers may be formed of a material such as AlGaInAs or GaInNAs, instead of InP or InGaAsP above. Further, the n-type substrate may be replaced by a p-type substrate. In such a case, the polarity of the laser diode is opposite to that of the laser diode using the n-type substrate.

Further, the interface between the InGaAsP light guiding layer 23 and the p-type InP cladding layer 24 is formed to have a cross-sectional saw tooth shape, constituting a diffraction grating 25. It should be noted that even though the example shown in FIG. 4 is configured such that the InGaAsP light guiding layer 23 and the diffraction grating 25 are provided on the p-type InP cladding layer 24 side, the present invention is not limited to this particular arrangement. It may be possible to employ any arrangement in which the diffraction grating 25 is formed near the active layer 22 along the waveguide direction (in FIG. 4, the direction parallel to the paper). For example, the InGaAsP light guiding layer 23 and the diffraction grating 25 may be provided on the n-type InP substrate 21 side. Further, the diffraction grating 25 may have a shape other than a saw tooth.

At the center portion of the resonator is provided a phase shift portion 26, at which the phase of the diffraction grating 25 is shifted. It should be noted that the phase shift portion 26 may not necessarily be disposed at the center portion of the resonator. For example, the phase shift portion 26 may be moved from the center portion toward the front facet side to increase the optical output from the front facet and thereby enhance the laser efficiency. Further, even though the resonator shown in FIG. 4 has only one phase shift portion 6, the present invention is not limited to this particular arrangement. The diffraction grating may include (one or) a plurality of phase shift portions. Providing a plurality of phase shift portions reduces the spatial hole burning in the axial direction within the resonator, which leads to stable single longitudinal mode oscillation even at high optical output.

On the other hand, the facets 27 and 28 of the resonator each have an antireflective film (not shown) thereon. If the reflectance of the facets is too high, there will be a reduction the yield of laser elements capable of oscillating in a single longitudinal mode. Therefore, the lower the reflectance of the facets 27 and 28, the better. Specifically, the reflectance should be 3% or less, preferably 0.5% or less.

The present embodiment is characterized in that the diffraction grating 25 does not extend into regions $A_4$ and $A_5$ adjacent the respective facets of the semiconductor laser (that is, these regions are not grated), as in the first embodiment, and furthermore the portions of the p-type InP cladding layer 24 immediately above the regions $A_4$ and $A_5$ have a lower carrier concentration than the other portion of the p-type InP cladding layer 24 (that is, the portion of the p-type InP cladding layer 24 in the region in which the diffraction grating 25 is provided). It should be noted that the larger the amount by which the carrier concentrations of the lower carrier concentration regions 24a and 24b are lower than the carrier concentration of the other portion of the cladding layer, the better. This tendency does not change with the carrier concentration of the cladding layer. According to the present invention, the carrier concentrations of the lower carrier concentration regions 24a and 24b are preferably one-half or less, more preferably one-tenth or less, of the carrier concentration of the portion of the cladding layer in the region in which the diffraction grating 25 is formed. Providing such low carrier concentration regions can reduce the currents flowing in the "ungrated" regions $A_4$ and $A_5$ so that they are smaller than the current flowing in the other region.

For example, when the portion of the p-type InP cladding layer 24 in the region in which the diffraction grating is provided has a carrier concentration of $1 \times 10^{18}$ $cm^{-3}$, the carrier concentrations of the lower carrier concentration regions 24a and 24b are preferably $0.5 \times 10^{18}$ $cm^{-3}$, more preferably $1 \times 10^{17}$ $cm^{-3}$. It should be noted that the lower carrier concentration regions 24a and 24b can be formed by impurity diffusion or ion implantation.

On the other hand, the regions $A_4$ and $A_5$ do not contribute to laser oscillation. Therefore, the shorter these regions, the better. Specifically, they are preferably 20 μm or less in length. For example, when the positional accuracy of the cleavage is ±2 μm, the lengths $l_4$ and $l_5$ of the regions $A_4$ and $A_5$, respectively, are preferably approximately 1 μm. In other words, according to the present embodiment, the diffraction grating 25 preferably does not extend into each end region of the resonator which extends 1 μm-20 μm from a respective one of the facets 27 and 28 toward the opposite end in the waveguide direction (that is, these end regions are preferably not grated).

Such an arrangement can produce the following effects in addition to the effects of the first embodiment. According to the present embodiment, the lower carrier concentration regions 24a and 24b are provided in the p-type InP cladding layer 24, which can reduce the currents flowing in the "ungrated" regions $A_4$ and $A_5$. It should be noted that the currents flowing in the regions $A_4$ and $A_5$ do not contribute to laser oscillation and therefore are not needed. Accordingly, reducing the currents flowing in these regions can reduce the oscillation threshold voltage and increase the laser efficiency.

Fourth Embodiment

Figure 5:
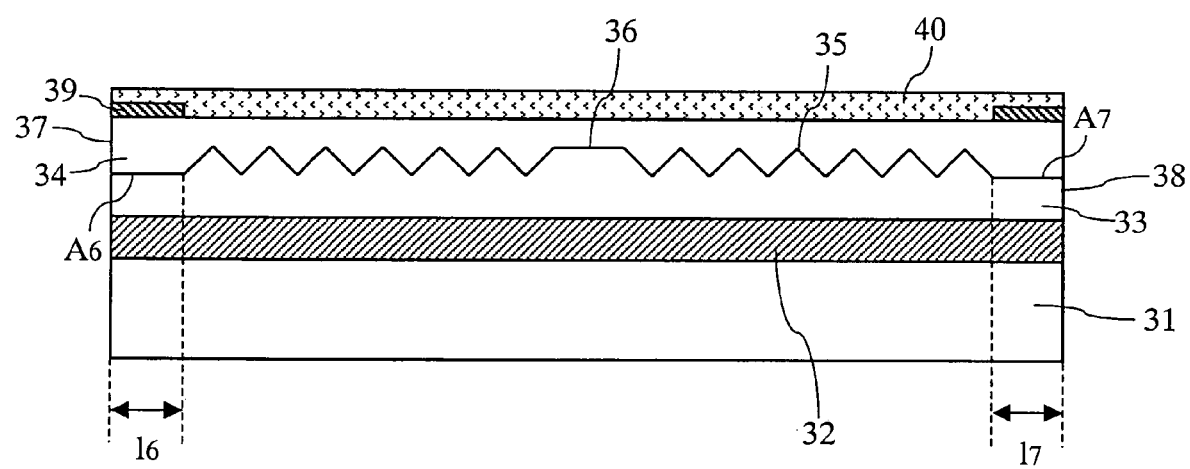
FIG. 5 is a schematic cross-sectional view of a distributed feedback laser diode according to a fourth embodiment.

FIG. 5 is a schematic cross-sectional view of the resonator portion of a distributed feedback laser diode according to a fourth embodiment of the present invention.

An active layer 32 of InGaAsP, an InGaAsP light guiding layer 33, a p-type InP cladding layer 34, and a metal electrode 40 are laminated onto one another over an n-type InP substrate 31 (a semiconductor substrate) in that order. It should be noted that these layers may be formed of a material such as AlGaInAs or GaInNAs, instead of InP or InGaAsP above. Further, the n-type substrate may be replaced by a p-type substrate. In such a case, the polarity of the laser diode is opposite to that of the laser diode using the n-type substrate.

Further, the interface between the InGaAsP light guiding layer 33 and the p-type InP cladding layer 34 is formed to have a cross-sectional saw tooth shape, constituting a diffraction grating 35. It should be noted that even though the example shown in FIG. 5 is configured such that the InGaAsP light guiding layer 33 and the diffraction grating 35 are provided on the p-type InP cladding layer 34 side, the present invention is not limited to this particular arrangement. It may be possible to employ any arrangement in which the diffraction grating 35 is formed near the active layer 32 along the waveguide direction (in FIG. 5, the direction parallel to the paper). For example, the InGaAsP light guiding layer 33 and the diffraction grating 35 may be provided on the n-type InP substrate 31 side. Further, the diffraction grating 35 may have a shape other than a saw tooth.

At the center portion of the resonator is provided a phase shift portion 36, at which the phase of the diffracting grating 35 is shifted. It should be noted that the phase shift portion 36 may not necessarily be disposed at the center portion of the resonator. For example, the phase shift portion 36 may be moved from the center portion toward the front facet side to increase the optical output from the front facet and thereby enhance the laser efficiency. Further, even though the resonator shown in FIG. 5 has only one phase shift portion 36, the present invention is not limited to this particular arrangement. The diffraction grating may include (one or) a plurality of phase shift portions. Providing a plurality of phase shift portions reduces the spatial hole burning in the axial direction within the resonator, which leads to stable single longitudinal mode oscillation even at high optical output.

On the other hand, the facets 37 and 38 of the resonator each have an antireflective film (not shown) thereon. If the reflectance of the facets is too high, there will be a reduction in the yield of laser elements capable of oscillating in a single longitudinal mode. Therefore, the lower the reflectance of the facets 37 and 38, the better. Specifically, the reflectance should be 3% or less, preferably 0.5% or less.

The present embodiment is characterized in that the diffraction grating 35 does not extend into regions $A_6$ and $A_7$ adjacent the respective facets of the semiconductor laser (that is, these regions are not grated), as in the first embodiment, and furthermore insulating layers 39 are formed between the metal electrode 40 and the portions of the p-type InP cladding layer 34 above the regions $A_6$ and $A_7$. The insulating layers 39 may be, for example, $SiO_2$ films. On the other hand, the regions $A_6$ and $A_7$ do not contribute to laser oscillation. Therefore, the shorter these regions, the better. Specifically, they are preferably 20 μm or less in length. For example, when the positional accuracy of the cleavage is ±2 μm, the lengths $l_6$ and $l_7$ of the regions $A_6$ and $A_7$, respectively, are preferably approximately 1 μm. In other words, according to the present embodiment, the diffraction grating 35 preferably does not extend into each end region which extends 1 μm-20 μm from a respective one of the facets 37 and 38 toward the opposite end in the waveguide direction (that is, these regions are preferably not grated).

Such an arrangement can produce the following effects in addition to the effects of the first embodiment. According to the present embodiment, the insulating layers 39 are formed between the metal electrode 40 and the portions of the p-type InP cladding 34 above the regions $A_6$ and $A_7$, which can reduce the currents flowing in the "ungrated" regions $A_6$ and $A_7$. It should be noted that the currents flowing in the regions $A_6$ and $A_7$ do not contribute to laser oscillation and therefore are not needed. Accordingly, reducing the currents flowing in these regions can reduce the oscillation threshold voltage and increase the laser efficiency.

Fifth Embodiment

Figure 6:
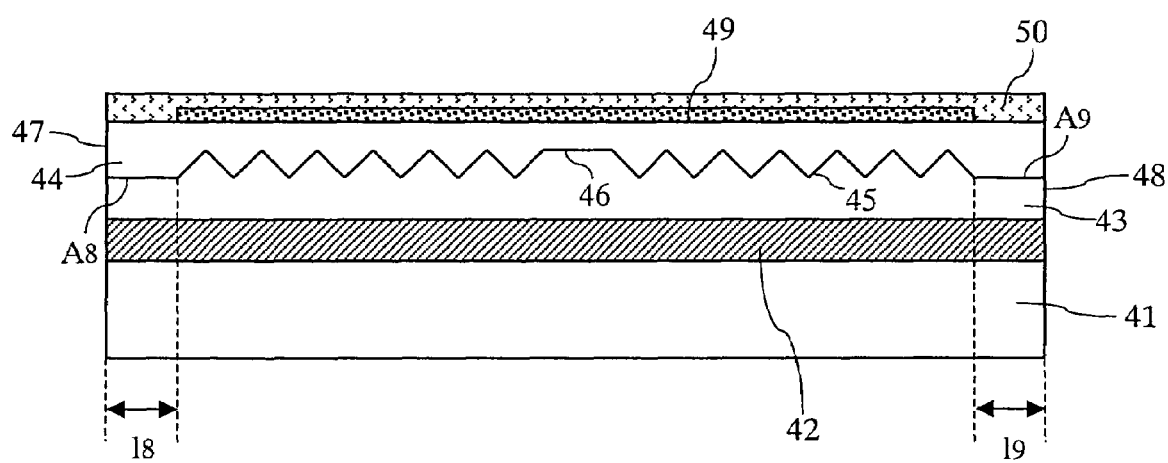
FIG. 6 is a schematic cross-sectional view of a distributed feedback laser diode according to a fifth embodiment.

FIG. 6 is a schematic cross-sectional view of the resonator portion of a distributed feedback laser diode according to a fifth embodiment of the present invention.

Referring to FIG. 6, an active layer 42 of InGaAsP, an InGaAsP light guiding layer 43, and a p-type InP cladding layer 44 are laminated onto one another over an n-type InP substrate 41 (a semiconductor substrate) in that order. It should be noted that these layers may be formed of a material such as AlGaInAs or GaInNAs, instead of InP or InGaAsP above. Further, the n-type substrate may be replaced by a p-type substrate. In such a case, the polarity of the laser diode is opposite to that of the laser diode using the n-type substrate.

Further, the interface between the InGaAsP light guiding layer 43 and the p-type InP cladding layer 44 is formed to have a cross-sectional saw tooth shape, constituting a diffraction grating 45. It should be noted that even though the example shown in FIG. 6 is configured such that the InGaAsP light guiding layer 43 and the diffraction grating 45 are provided on the p-type InP cladding layer 44 side, the present invention is not limited to this particular arrangement. It may be possible to employ any arrangement in which the diffraction grating 45 is formed near the active layer 42 along the waveguide direction (in FIG. 6, the direction parallel to the paper). For example, the InGaAsP light guiding layer 43 and the diffraction grating 45 may be provided on the n-type InP substrate 41 side. Further, the diffraction grating 45 may have a shape other than a saw tooth.

At the center portion of the resonator is provided a phase shift portion 46, at which the phase of the diffraction grating 45 is shifted. It should be noted that the phase shift portion 46 may not necessarily be disposed at the center portion of the resonator. For example, the phase shift portion 46 may be moved from the center portion toward the front facet side to increase the optical output from the front facet and thereby enhance the laser efficiency. Further, even though the resonator shown in FIG. 6 has only one phase shift portion 46, the present invention is not limited to this particular arrangement. The diffraction grating may include (one or) a plurality of phase shift portions. Providing a plurality of phase shift portions reduces the spatial hole burning in the axial direction within the resonator, which leads to stable single longitudinal mode oscillation even at high optical output.

On the other hand, the facets 47 and 48 of the resonator each have an antireflective film (not shown) thereon. If the reflectance of the facets is too high, there will be a reduction in the yield of laser elements capable of oscillating in a single longitudinal mode. Therefore, the lower the reflectance of the facets 47 and 48, the better. Specifically, the reflectance should be 3% or less, preferably 0.5% or less.

The present embodiment is characterized in that the diffraction grating 45 does not extend into regions $A_8$ and $A_9$ adjacent the respective facets of the semiconductor laser (that is, these regions are not grated), as in the first embodiment. Further, the present embodiment is also characterized in that a p-type InGaAs contact layer 49 is provided on the portion of the p-type InP cladding layer 44 above the diffraction grating 45 and furthermore a metal electrode 50 is provided over the p-type InP cladding layer 44 such that the metal electrode 50 covers the p-type InGaAs contact layer 49.

The regions $A_8$ and $A_9$ do not contribute to laser oscillation. Therefore, the shorter these regions, the better. Specifically, they are preferably 20 μm or less in length. For example, when the positional accuracy of the cleavage is ±2 μm, the lengths $l_8$ and $l_9$ of the regions $A_8$ and $A_9$, respectively, are preferably approximately 1 μm. In other words, according to the present embodiment, the diffraction grating 45 preferably does not extend into each end region of the resonator which extends 1 μm-20 μm from a respective one of the facets 47 and 48 toward the opposite end in the waveguide direction (that is, these regions are preferably not grated).

Such an arrangement can produce the following effects in addition to the effects of the first embodiment. According to the present embodiment, the p-type InGaAs contact layer 49 is not formed on the portions of the p-type InP cladding layer 44 above the "ungrated" regions $A_8$ and $A_9$, which can reduce the currents flowing in the "ungrated" regions $A_8$ and $A_9$. It should be noted that the currents flowing in the regions $A_8$ and $A_9$ do not contribute to laser oscillation and therefore are not needed. Accordingly, reducing the currents flowing in these regions can reduce the oscillation threshold voltage and increase the laser efficiency.

Sixth Embodiment

A description will be given of a distributed feedback laser diode according to a sixth embodiment of the present invention with reference to FIGS. 7A to 7C.

Figure 7A:
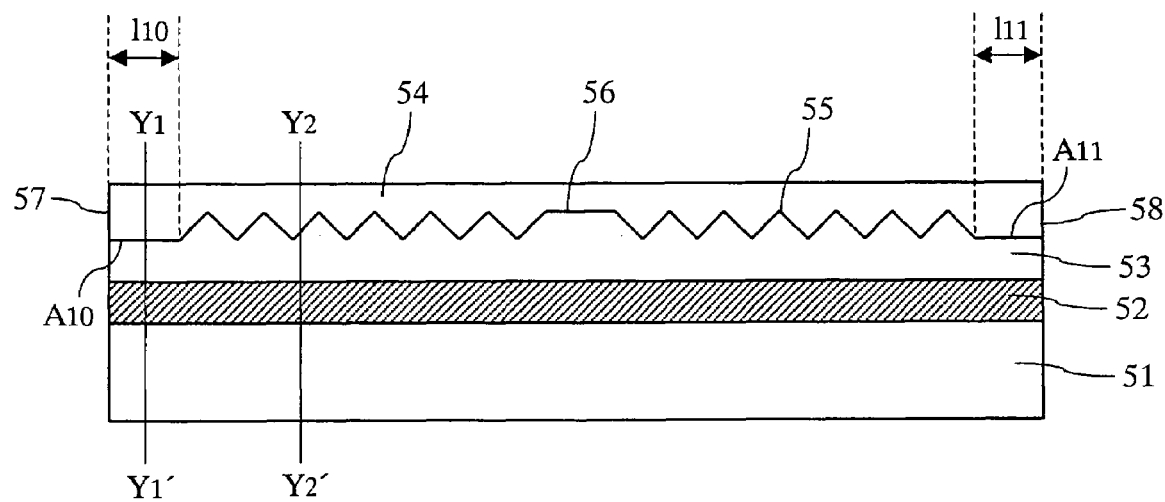
FIGS. 7A-7C are schematic cross-sectional views of a distributed feedback laser diode according to a sixth embodiment.

FIG. 7A is a schematic cross-sectional view of the resonator portion of the distributed feedback laser diode of the present embodiment. Referring to the figure, an active layer 52 of InGaAsP, an InGaAsP light guiding layer 53, and a p-type InP cladding layer 54 are laminated onto one another over an n-type InP substrate 51 (a semiconductor substrate) in that order. It should be noted that these layers may be formed of a material such as AlGaInAs or GaInNAs, instead of InP or InGaAsP above. Further, the n-type substrate may be replaced by a p-type substrate. In such a case, the polarity of the laser diode is opposite to that of the laser diode using the n-type substrate.

Further, the interface between the InGaAsP light guiding layer 53 and the p-type InP cladding layer 54 is formed to have a cross-sectional saw tooth shape, constituting a diffraction grating 55. It should be noted that even though the example shown in FIG. 7A is configured such that the InGaAsP light guiding layer 53 and the diffraction grating 55 are provided on the p-type InP cladding layer 54 side, the present invention is not limited to this particular arrangement. It may be possible to employ any arrangement in which the diffraction grating 55 is formed near the active layer 52 along the waveguide direction (in FIG. 7A, the direction parallel to the paper). For example, the InGaAsP light guiding layer 53 and the diffraction grating 55 may be provided on the n-type InP substrate 51 side. Further, the diffraction grating 55 may have a shape other than a saw tooth.

At the center portion of the resonator is provided a phase shift portion 56, at which the phase of the diffraction grating 55 is shifted. It should be noted that the phase shift portion 56 may not necessarily be disposed at the center portion of the resonator. For example, the phase shift portion 56 may be moved from the center portion toward the front facet side to increase the optical output from the front facet and thereby enhance the laser efficiency. Further, even though the resonator shown in FIG. 7A has only one phase shift portion 56, the present invention is not limited to this particular arrangement. The diffraction grating may include (one or) a plurality of phase shift portions. Providing a plurality of phase shift portions reduces the spatial hole burning in the axial direction within the resonator, which leads to stable single longitudinal mode oscillation even at high optical output.

On the other hand, the facets 57 and 58 of the resonator each have an antireflective film (not shown) thereon. If the reflectance of the facets is too high, there will be a reduction in the yield of laser elements capable of oscillating in a single longitudinal mode. Therefore, the lower the reflectance of the facets 57 and 58, the better. Specifically, the reflectance should be 3% or less, preferably 0.5% or less.

The present embodiment is characterized in that the diffraction grating 55 does not extend into regions $A_{10}$ and $A_{11}$ adjacent the respective facets of the semiconductor laser (that is, these regions are not grated), as in the first embodiment, and furthermore the portions of the active layer 52 within the regions $A_{10}$ and $A_{11}$ have a smaller width (measured along a direction perpendicular to the waveguide direction) than the other portion of the active layer 52.

The regions $A_{10}$ and $A_{11}$ do not contribute to laser oscillation. Therefore, the shorter these regions, the better. Specifically, they are preferably 20 μm or less in length. For example, when the positional accuracy of the cleavage is ±2 μm, the lengths $l_{10}$ and $l_{11}$ of the regions $A_{10}$ and $A_{11}$, respectively, are preferably approximately 1 μm. In other words, according to the present embodiment, the diffraction grating 55 preferably does not extend into each end region of the resonator which extends 1 μm-20 μm from a respective one of the facets 57 and 58 toward the opposite end in the waveguide direction (that is, these regions are preferably not grated).

Figure 7B:
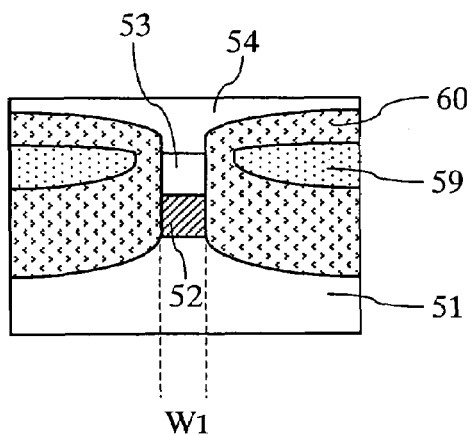
Figure 7C:
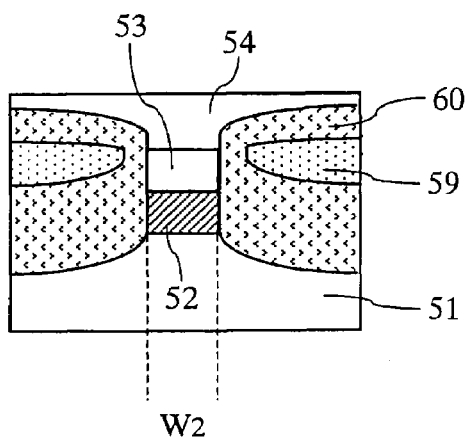

FIG. 7B is a cross-sectional view of the distributed feedback laser diode shown in FIG. 7A taken along line $Y_1$-$Y_1'$; and FIG. 7C is a cross-sectional view of the distributed feedback laser diode taken along line $Y_2$-$Y_2'$. As shown in these figures, the width $W_1$ of the portions of the active layer 52 and the overlying InGaAs light guiding layer 53 within the "ungrated" regions $A_{10}$ and $A_{11}$ is smaller than the width $W_2$ of the other portions of the active layer 52 and the InGaAs light guiding layer 53 (the other portions being in the region in which the diffracting grating 55 is provided). It should be noted that in FIGS. 7B and 7C, reference numeral 59 denotes an n-type InP blocking layer and 60 denotes a p-type InP cladding layer.

Such an arrangement can produce the following effects in addition to the effects of the first embodiment. According to the present embodiment, the (cross-sectional) areas of the portions of the active layer 52 within the "ungrated" regions $A_{10}$ and $A_{11}$ are made small, which can reduce the currents flowing in these regions. It should be noted that the currents flowing in the regions $A_{10}$ and $A_{11}$ do not contribute to laser oscillation and therefore are not needed. Accordingly, reducing the currents flowing in these regions can reduce the oscillation threshold voltage and increase the laser efficiency.

Seventh Embodiment

A description will be given of a distributed feedback laser diode according to a seventh embodiment of the present invention with reference to FIGS. 8A to 8C.

Figure 8A:
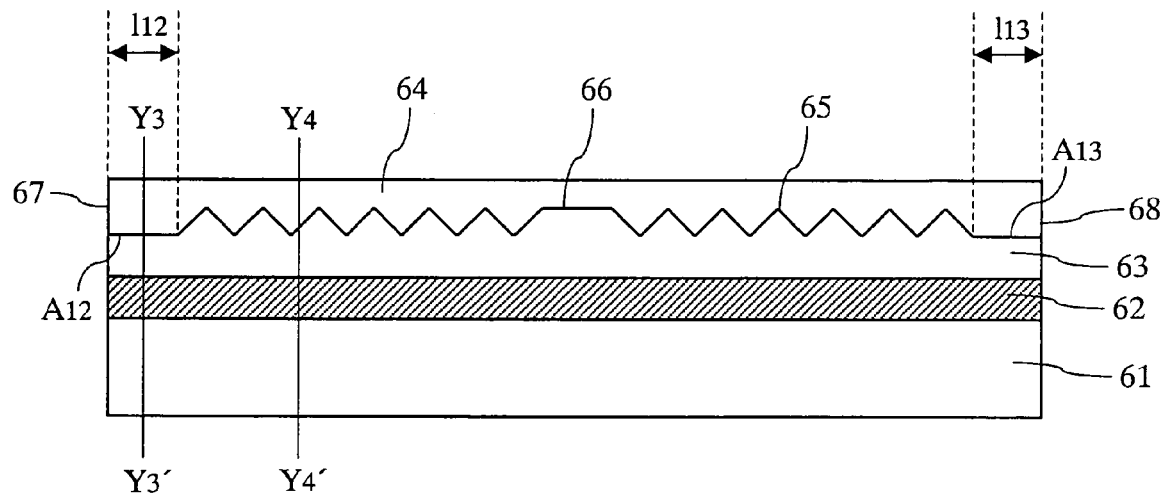
FIGS. 8A-8C are schematic cross-sectional views of a distributed feedback laser diode according to a seventh embodiment.

FIG. 8A is a schematic cross-sectional view of the resonator portion of the distributed feedback laser diode of the present embodiment. Referring to the figure, an active layer 62 of InGaAsP, an InGaAsP light guiding layer 63, and a p-type InP cladding layer 64 are laminated onto one another over an n-type InP substrate 61 (a semiconductor substrate) in that order. It should be noted that these layers may be formed of a material such as AlGaInAs or GaInNAs, instead of InP or InGaAsP above. Further, the n-type substrate may be replaced by a p-type substrate. In such a case, the polarity of the laser diode is opposite to that of the laser diode using the n-type substrate.

Further, the interface between the InGaAsP light guiding layer 63 and the p-type InP cladding layer 64 is formed to have a cross-sectional saw tooth shape, constituting a diffraction grating 65. It should be noted that even though the example shown in FIG. 8A is configured such that the InGaAsP light guiding layer 63 and the diffraction grating 65 are provided on the p-type InP cladding layer 64 side, the present invention is not limited to this particular arrangement. It may be possible to employ any arrangement in which the diffraction grating 65 is formed near the active layer 62 along the waveguide direction (in FIG. 8A, the direction parallel to the paper). For example, the InGaAsP light guiding layer 63 and the diffraction grating 65 may be provided on the n-type InP substrate 61 side. Further, the diffraction grating 65 may have a shape other than a saw tooth.

At the center portion of the resonator is provided a phase shift portion 66, at which the phase of the diffraction grating 65 is shifted. It should be noted that the phase shift portion 66 may not necessarily be disposed at the center portion of the resonator. For example, the phase shift portion 66 may be moved from the center portion toward the front facet side to increase the optical output from the front facet and thereby enhance the laser efficiency. Further, even though the resonator shown in FIG. 8A has only one phase shift portion 66, the present invention is not limited to this particular arrangement. The diffraction grating may include (one or) a plurality of phase shift portions. Providing a plurality of phase shift portions reduces the spatial hole burning in the axial direction within the resonator, which leads to stable single longitudinal mode oscillation even at high optical output.

On the other hand, the facets 67 and 68 of the resonator each have an antireflective film (not shown) thereon. If the reflectance of the facets is too high, there will be a reduction in the yield of laser elements capable of oscillating in a single longitudinal mode. Therefore, the lower the reflectance of the facets 67 and 68, the better. Specifically, the reflectance should be 3% or less, preferably 0.5% or less.

The present embodiment is characterized in that the diffraction grating 65 does not extend into regions $A_{12}$ and $A_{13}$ adjacent the respective facets of the semiconductor laser (that is, these regions are not grated), as in the first embodiment. Further, the present embodiment is also characterized in that the portions of the ridge within the regions $A_{12}$ and $A_{13}$ have a smaller width (measured along a direction perpendicular to the waveguide direction) than the other portion of the ridge (the other portion being in the region in which the diffraction grating 65 is provided).

The regions $A_{12}$ and $A_{13}$ do not contribute to laser oscillation. Therefore, the shorter these regions, the better. Specifically, they are preferably 20 μm or less in length. For example, when the positional accuracy of the cleavage is ±2 μm, the lengths $l_{12}$ and $l_{13}$ of the regions $A_{12}$ and $A_{13}$, respectively, are preferably approximately 1 μm. In other words, according to the present embodiment, the diffraction grating 65 preferably does not extend into each end region of the resonator which extends 1 μm-20 μm from a respective one of the facets 67 and 68 toward the opposite end in the waveguide direction (that is, these end regions are preferably not grated).

Figure 8B:
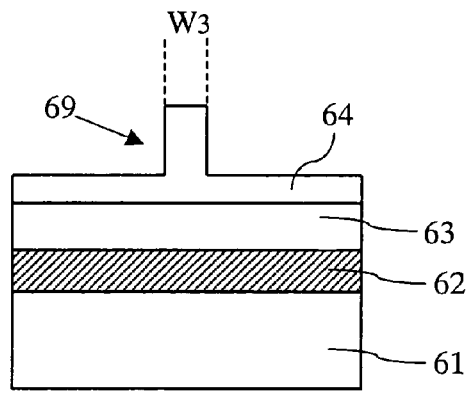
Figure 8C:
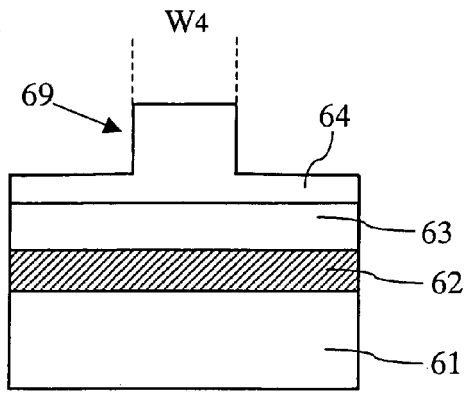

FIG. 8B is a cross-sectional view of the distributed feedback laser diode shown in FIG. 8A taken along line $Y_3$-$Y_3'$; and FIG. 8C is a cross-sectional view of the distributed feedback laser diode taken along line $Y_4$-$Y_4'$. As shown in these figures, the width $W_3$ of the portions of the ridge 69 within the "ungrated" regions $A_{12}$ and $A_{13}$ is smaller than the width $W_4$ of the other portion of the ridge 69 (the other portion being in the region in which the diffraction grating 65 is provided). It should be noted that the ridge 69 is a ridge-shaped waveguide formed of the p-type InP cladding layer 64.

Such an arrangement can produce the following effects in addition to the effects of the first embodiment. According to the present embodiment, the (cross-sectional) areas of the portions of the ridge 69 within the "ungrated" regions $A_{12}$ and $A_{13}$ are made small to increase the resistance, which can reduce the currents flowing in these regions. It should be noted that the currents flowing in the regions $A_{12}$ and $A_{13}$ do not contribute to laser oscillation and therefore are not needed. Accordingly, reducing the currents flowing in these regions can reduce the oscillation threshold voltage and increase the laser efficiency.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2004-171586, filed on Jun. 9, 2004 including specification, claims, drawings and summary, on which the Convention priority of the present application is based, are incorporated herein by reference in its entirely.

What is claimed is:

1. A distributed feedback laser diode comprising:
a semiconductor substrate;
an active layer supported by said semiconductor substrate;
a cladding layer supported by said active layer;
a diffraction grating near said active layer and extending along a waveguide direction, said diffraction grating having at least one phase shift portion; and
two facets transverse to said active layer, wherein
both facets of said distributed feedback laser diode have thereon an antireflective film having a reflectance of no more than 3%,
said diffraction grating does not extend into end regions of said distributed feedback laser diode, each end region extending 1 μm-20 μm from a respective one of said facets toward an opposite end in the waveguide direction,
said active layer extends into at least one of said end regions to one of said facets, and
the portions of said cladding layer within said end regions, into which said diffraction grating does not extend, each have a first part with a carrier concentration lower than carrier concentration of a second part of said cladding layer, said second part being in a region in which said diffraction grating is located.

2. The distributed feedback laser diode according to claim 1, further comprising:
a metal electrode on said cladding layer; and
an insulating layer between said metal electrode and said end regions, into which said diffraction grating does not extend.

3. The distributed feedback laser diode according to claim 2, wherein said insulating layer is silicon oxide.

4. A distributed feedback laser diode comprising:
a distributed feedback laser diode comprising:
a semiconductor substrate;
an active layer supported by said semiconductor substrate;
a cladding layer supported by said active layer;
a diffraction grating near said active layer and extending along a waveguide direction, said diffraction grating having at least one phase shift portion; and
two facets transverse to said active layer, wherein
both facets of said distributed feedback laser diode have thereon an antireflective film having a reflectance of no more than 3%,
said diffraction grating does not extend into end regions of said distributed feedback laser diode, each end region extending 1 μm-20 μm from a respective one of said facets toward an opposite end in the waveguide direction, and
the portions of said cladding layer within said end regions, into which said diffraction grating does not extend, each have a first part with a carrier concentration that is no more than one-half of the carrier concentration of a second part of said cladding layer, said second part being in a region in which said diffraction grating is located.

5. A distributed feedback laser diode comprising:
a semiconductor substrate;
an active layer supported by said semiconductor substrate;
a cladding layer supported by said active layer;
a diffraction grating near said active layer and extending along a waveguide direction, said diffraction grating having at least one phase shift portion; and
two facets transverse to said active layer, wherein both facets of said distributed feedback laser diode have thereon an antireflective film having a reflectance of no more than 3%, said diffraction grating does not extend into end regions of said distributed feedback laser diode, each end region extending 1 µ-20 µm from a respective one of said facets toward an opposite end in the waveguide direction, said active layer extends into at least one of said end regions to one of said facts, and first parts of said active layer within said end portions, into which said diffraction grating does not extend, each have a smaller dimension, in a direction perpendicular to the waveguide direction, than a second part of said active layer, said second part being in a region in which said diffraction grating is located.

6. A distributed feedback laser diode comprising:

a semiconductor substrate;

an active layer supported by said semiconductor substrate;

a cladding layer supported by said active layer;

a diffraction grating near said active layer and extending along a waveguide direction, said diffraction grating having at least one phase shift portion; and two facets transverse to said active layer, wherein both facets of said distributed feedback laser diode have thereon an antireflective film having a reflectance of no more than 3%.

said diffraction grating does not extend into end regions of said distributed feedback laser diode, each end region extending 1 µm-20 µm from a respective one of said facets toward an opposite end in the waveguide direction, said active layer extends into at least one of said end regions to one of said facets;

said cladding layer has a ridge; and first parts of said ridge within said end regions, into which said diffraction grating does not extend, each have a smaller dimension, in a direction perpendicular to the waveguide direction, than a second part of said ridge, the second part being in a region in which said diffraction grating is located.

* * * * *